United States Patent
Liu et al.

(10) Patent No.: US 12,356,588 B2
(45) Date of Patent: Jul. 8, 2025

(54) IMMERSED COOLING SYSTEM AND IMMERSED COOLING CABINET

(71) Applicant: Fulian Precision Electronics (Tianjin) Co., LTD., Tianjin (CN)

(72) Inventors: Tsung-Lin Liu, Neihu (TW); Chin-Han Chan, New Taipei (TW); Yu-Chia Ting, Neihu (TW); Chun-Wei Lin, New Taipei (TW); Chia-Nan Pai, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 248 days.

(21) Appl. No.: 18/221,439

(22) Filed: Jul. 13, 2023

(65) Prior Publication Data

US 2024/0334646 A1 Oct. 3, 2024

(30) Foreign Application Priority Data

Mar. 29, 2023 (CN) .......................... 202310319564.0

(51) Int. Cl.
*H05K 7/20* (2006.01)

(52) U.S. Cl.
CPC ..... *H05K 7/20272* (2013.01); *H05K 7/20236* (2013.01); *H05K 7/20263* (2013.01); *H05K 7/20781* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,943,211 A * | 8/1999 | Havey | ................... | H01L 25/105 |
| | | | | 174/15.1 |
| 10,156,873 B2 * | 12/2018 | Shelnutt | ............. | H05K 7/20809 |
| 10,212,857 B2 * | 2/2019 | Eriksen | ................ | H05K 7/1488 |
| 11,169,582 B2 * | 11/2021 | Mao | .................. | H01M 10/6568 |
| 11,252,844 B2 * | 2/2022 | Shao | .................. | H05K 7/20272 |
| 11,284,543 B2 * | 3/2022 | Gao | .................... | H05K 7/20509 |
| 11,659,688 B2 * | 5/2023 | Gao | .................... | H05K 7/20818 |
| | | | | 361/679.53 |
| 11,714,467 B2 * | 8/2023 | Mao | .................... | H05K 7/20272 |
| | | | | 361/699 |

(Continued)

FOREIGN PATENT DOCUMENTS

| | | |
|---|---|---|
| CN | 111352489 | 5/2021 |
| CN | 115023075 | 9/2022 |

*Primary Examiner* — Lisa Lea-Edmonds
(74) *Attorney, Agent, or Firm* — ScienBiziP, P.C.

(57) ABSTRACT

An immersed cooling system for cooling electronic devices includes a cooling tank accommodating coolant and multiple electronic devices and a liquid cooling circuit for circulating coolant, the electronic device includes key components and common components, the liquid cooling circuit includes cooling branches connected to the key components for cooling, the coolant in the cooling branches flows faster than the coolant in the cooling tank, which improves the heat dissipation effect of the key components and the utilization rate of the coolant by cooling the key components and the common components with different flow rates of coolant, reduces the energy consumption of the immersed cooling system and provides a more efficient thermal solution. An immersed cooling cabinet is also provided.

18 Claims, 5 Drawing Sheets

(56) References Cited

U.S. PATENT DOCUMENTS

| | | | |
|---|---|---|---|
| 11,882,670 B2 * | 1/2024 | Gao | H05K 7/20772 |
| 11,889,658 B2 * | 1/2024 | Gao | H05K 7/20781 |
| 12,001,251 B2 * | 6/2024 | Mao | F28D 1/0206 |
| 12,089,369 B2 * | 9/2024 | Cheng | H05K 7/20818 |
| 2011/0132579 A1 * | 6/2011 | Best | H05K 7/20327 |
| | | | 165/104.31 |
| 2017/0177041 A1 * | 6/2017 | Shelnutt | H05K 7/20809 |
| 2017/0332520 A1 * | 11/2017 | Eriksen | H05K 7/20781 |
| 2021/0368655 A1 * | 11/2021 | Gao | H05K 7/20209 |
| 2023/0084765 A1 * | 3/2023 | Gao | H05K 7/20254 |
| | | | 361/679.53 |
| 2023/0209781 A1 * | 6/2023 | Gao | H05K 7/20272 |
| | | | 700/281 |
| 2023/0217625 A1 * | 7/2023 | Gao | H05K 7/20781 |
| 2023/0247803 A1 * | 8/2023 | Best | H05K 7/20327 |
| | | | 165/104.31 |
| 2023/0276601 A1 * | 8/2023 | Best | H05K 7/2079 |
| | | | 165/104.31 |
| 2023/0301027 A1 * | 9/2023 | Gao | H05K 7/20836 |
| | | | 361/700 |
| 2023/0305609 A1 * | 9/2023 | Mao | F28D 1/0206 |
| 2023/0320033 A1 * | 10/2023 | Cheng | H05K 7/20327 |
| | | | 361/679.47 |
| 2024/0008223 A1 * | 1/2024 | Tu | H05K 7/20327 |
| 2024/0015926 A1 * | 1/2024 | Tu | H05K 7/20809 |
| 2024/0015929 A1 * | 1/2024 | Tu | H05K 7/203 |
| 2024/0015930 A1 * | 1/2024 | Tu | H05K 7/20318 |
| 2024/0138128 A1 * | 4/2024 | Malouin | H05K 7/20836 |
| 2024/0237307 A9 * | 7/2024 | Malouin | G06F 1/20 |
| 2024/0256012 A1 * | 8/2024 | Mao | G06F 1/20 |
| 2024/0334646 A1 * | 10/2024 | Liu | H05K 7/20236 |

\* cited by examiner

IMMERSED COOLING SYSTEM AND IMMERSED COOLING CABINET

CROSS-REFERENCE TO RELATED APPLICATION

This application claims priority to China Application No. 202310319564.0, having a filing date of Mar. 29, 2023, filed in China State Intellectual Property Administration, the entire contents of which are hereby incorporate by reference.

FIELD

The subject matter relates to electronic device heat dissipation technologies, and more particularly to an immersed cooling system and an immersed cooling cabinet.

BACKGROUND

Computing devices, such as server, can generate a large amount of heat during use. The computing components can be susceptible to damage from the heat and commonly require cooling systems to maintain the component temperatures in a safe range during heavy processing or usage loads. Liquid cooling can effectively cool components as liquid working fluids have more thermal mass than air or gas cooling. As server systems become more advanced, cooling them has become increasingly important. A solution for cooling the computing device is to immerse the entire computing device in liquid. The liquid working fluid can be maintained at a lower temperature by allowing vaporized fluid to rise out of the liquid. However, because the different electronic components on the computing device, such as key component and general component, can generate varying amounts of heat, they have different cooling needs. If the liquid coolant flows uniformly over all components of the computing device, there can result in inadequate cooling for key components and unnecessary waste for general component. Therefore, optimizing the heat conduction of key components of the computing device can have a positive impact on energy conservation.

Therefore, there is room for improvement within the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the disclosure.

It should be understood that, the terms "first" and "second" are used to distinguish between elements and are not used to denote a particular order or imply a number of technical features, therefore, unless specifically defined, features described as "first" and "second" may expressly or implicitly include one or more of the stated features. In the description of the present application, "plurality" means "two or more", unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A description of the hereinafter described embodiments of the disclosure is presented herein with reference to the figures by way of exemplification and not as limitation.

Figure 1:
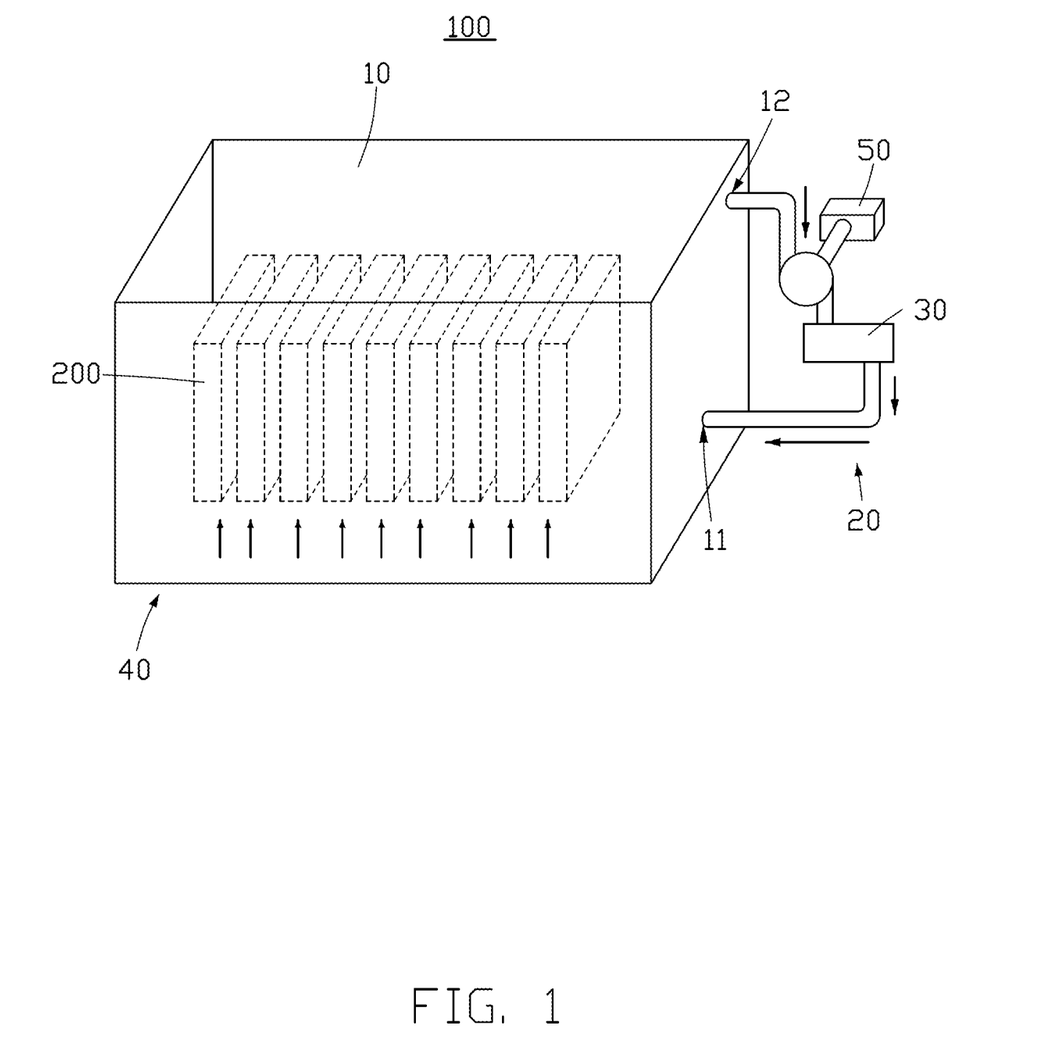
FIG. 1 is a perspective view of an immersed cooling system according to a first embodiment of the disclosure.
Figure 2:
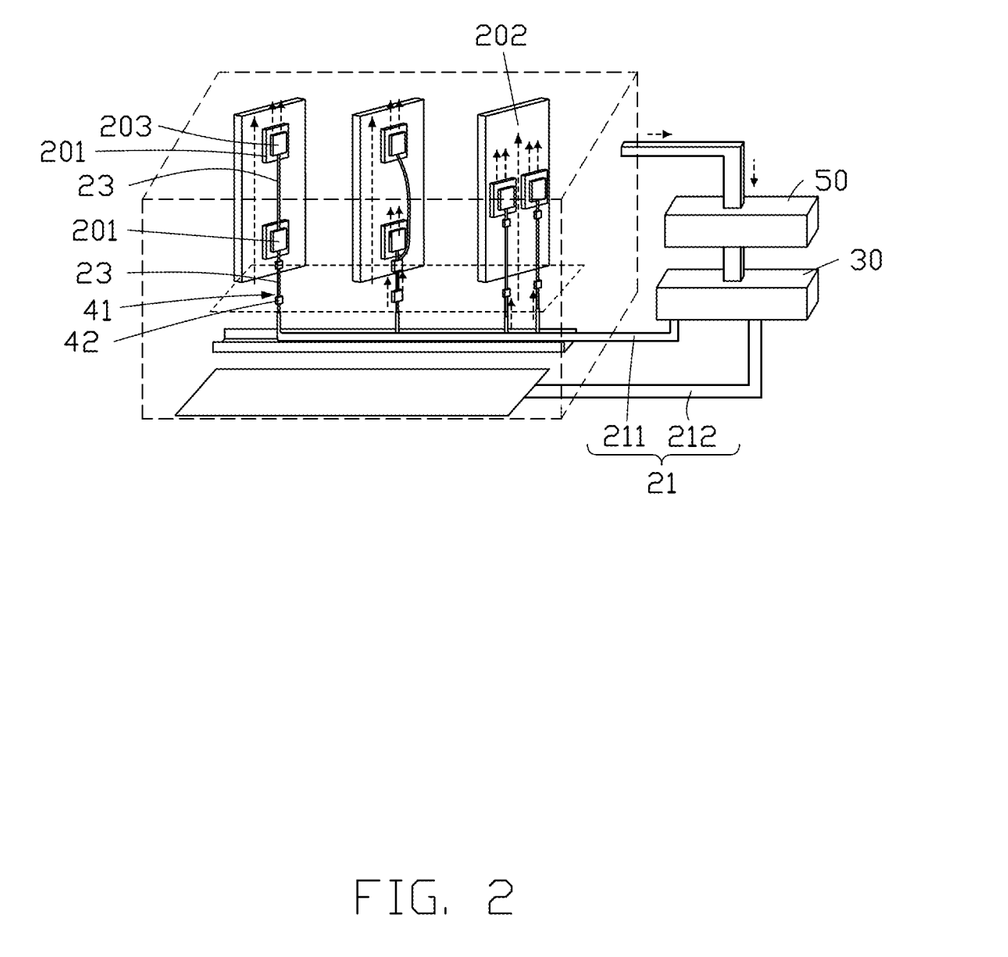
FIG. 2 is a perspective view of an immersed cooling system according to a second embodiment of the disclosure.

Referring to FIG. 1 and FIG. 2, according to a first embodiment of the disclosure, an immersed cooling system 100 for cooling electronic device 200 is provided. The immersed cooling system 100 includes a cooling tank 10, a liquid cooling circuit 20, a heat exchanger 30, a manifold 40, and a pump module 50. In particular, the cooling tank 10 is used to contain the coolant and multiple electronic devices 200. The cooling tank 10 has an inlet 11 near the bottom and an outlet 12 near the top. The liquid cooling circuit 20 includes a supply line 21, a return line 22, and a plurality of cooling branches 23 connected to the supply line 21. The supply line 21 is connected to the inlet 11 for supplying coolant to the cooling tank 10, and the return line 22 is connected to the outlet 12 for discharging coolant that has been used for cooling down the electronic devices 200 from the cooling tank 10. The heat exchanger 30 is connected between the supply line 21 and the return line 22 for cooling down the coolant from the return line 22 and supplying the coolant to the supply line 21. The cooling branches 23 are located in the cooling tank 10, the manifold 40 is connected between the supply line 21 and the cooling branches 23 for distributing the coolant from the supply line 21 to the cooling branches 23. Then the supply line 21 supplies coolant to the cooling tank 10 and the cooling branches 23. The manifold 40 has a plurality of distribution ports 41 that correspond to the plurality of cooling branches 23, each distribution port 41 is connected to a corresponding cooling branch 23.

Each electronic device 200 includes key components 201 and common components 202, heat generated by the key components accounts for much of the heat generated by the electronic device. Each cooling branch 23 is connected to one key component 201 for supplying the coolant from the supply line 21 to each key component 201 for cooling. The pump module 50 is connected in the liquid cooling circuit 20 and controls the flow rate of the coolant passing through the cooling branches 23 to be higher than that of the coolant in the cooling tank 10.

In operation, the power and heat dissipation of the key components 201 and the common component 202 on the electronic device 200 are different. The power of the key components 201 (such as CPU and GPU, etc.) may account for majority of the total heat dissipation of the electronic device 200. When using the immersed cooling system 100 provided by this embodiment to cool the electronic device 200, the cooling branch 23 is connected to the key components 201, and the pump module 50 controls the flow rate of the coolant passing through the cooling branch 23 to be higher than that of the other coolant in the cooling tank 10. That is, the flow rate of the coolant passing through the key components 201 is higher than that passing through the common components 202, improving the heat dissipation effect of the key components 201. This embodiment effectively improves the heat dissipation effect of the key components 201 and the utilization rate of the coolant by cooling the key components 201 and the common components 202 with different flow rates of coolant, reduces the energy consumption of the immersed cooling system 100 and provides a more efficient thermal solution.

According to a second embodiment, as shown in FIG. 2, the supply line 21 includes a proprietary supply line 211 and a common supply line 212. The proprietary supply line 211 extends through the inlet 11 to connect to the manifold 40 and is used to supply coolant to the cooling branch 23. The common supply line 212 is connected to the inlet 11 to supply coolant to the cooling tank 10.

In this embodiment, each key component 201 is connected to the cooling branch 23 by a quick disconnector 42.

Figure 3:
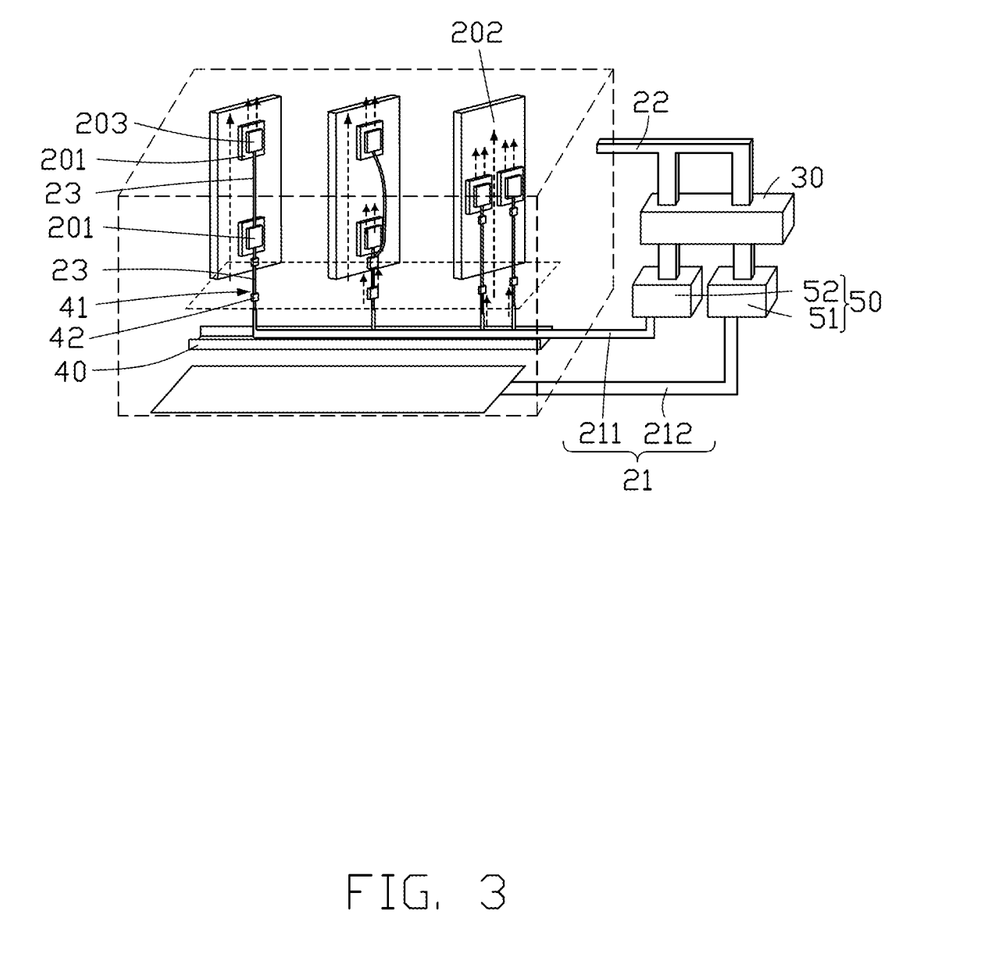
FIG. 3 is a perspective view of an immersed cooling system according to a third embodiment of the disclosure.

Referring to FIG. 3, according to a third embodiment, the pump module 50 includes a first pump 51 and a second pump 52. The first pump 51 is connected to the proprietary pipe 211, while the second pump 52 is connected to the common pipe 212. The first pump 51 and the second pump 52 control the flow rate of the coolant flowing through the proprietary pipe 211 to be greater than the flow rate of the coolant flowing through the common pipe 212.

In this way, the coolant in the common supply line 212 flows directly into the cooling tank 10, while the coolant in the proprietary supply line 211 flows into the cooling branch 23, thereby the coolant in the cooling branch 23 and the coolant in the cooling tank 10 are controlled independently. The flow rate of the coolant in the proprietary pipe 211 and the common pipe 212 can be controlled by the first pump 51 and the second pump 52, respectively. This ensures that the flow rate of the coolant in the cooling branch 23 is higher than that in the cooling tank 10, and separating control of the coolant passing through the key components 201 and the common components 202 can be achieved.

Alternatively, the cross-sectional area of the common supply line 212 is greater than that of the proprietary supply line 211. In this case, it is not necessary to set the first pump 51 and the second pump 52 to ensure that the coolant flow rate in the common supply line 212 is lower than that in the proprietary supply line 211.

Figure 4:
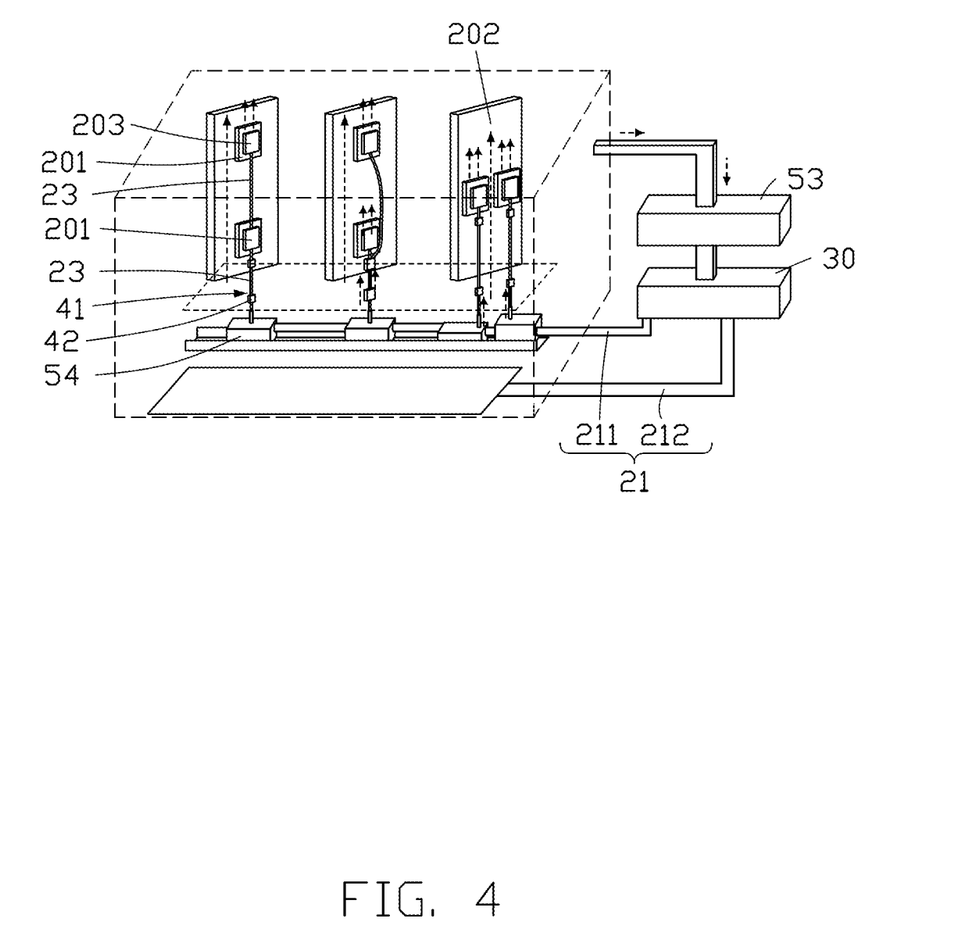
FIG. 4 is a perspective view of an immersed cooling system according to a fourth embodiment of the disclosure.

According to a fourth embodiment, as shown in FIG. 4, the supply line 21 includes a proprietary supply line 211 and a common supply line 212. The proprietary supply line 211 extends through the inlet 11 to connect to the manifold 40 and is used to supply coolant to the cooling branch 23. The common supply line 212 is connected to the inlet 11 to supply coolant to the cooling tank 10. The pump module 50 includes a third pump 53 connected in the return line 22 for pumping the coolant to the heat exchanger 30 and multiple fourth pumps 54 for pumping the coolant to the cooling branches 23. Each fourth pump 54 is connected to one distribution port 41 for supplying coolant to one cooling branch 23. The third pump 53 and the fourth pumps 54 control the coolant flow rate through the cooling branches 23 to be greater than that through the cooling tank 10.

In this way, the coolant in the common supply line 212 flows directly into the cooling tank 10, while the coolant in the proprietary supply line 211 flows into the cooling branch 23, thereby the coolant in the cooling branch 23 and the coolant in the cooling tank 10 are controlled independently. The third pump 53 controls the coolant in the return line 22, the fourth pumps 54 control the coolant in each cooling branch 23. The flow rate of the coolant in the return line 22 and the cooling branches 23 can be controlled by the third pump 53 and the fourth pump 54, respectively, ensuring that the flow rate of the coolant in the cooling branches 23 are higher than that in the cooling tank 10, and achieves separate control of the coolant passing through the key components 201 and the common components 202.

Alternatively, the cross-sectional area of the common pipe 212 is larger than that of the cooling branch 23. Therefore, it is not necessary to arrange the third pump 53 and the fourth pump 54 to ensure that the coolant flow rate through the cooling branches 23 is greater than that through the common pipe 212.

According to further embodiments, each electronic device 200 includes multiple key components 201, each key component 201 is provided with a heat dissipating plate 203. Each electronic device 200 is connected in one cooling branch 23, and the multiple heat dissipating plates 203 in each electronic device 200 are connected in series to the one cooling branch 23.

In other embodiments, each electronic device 200 includes multiple key components 201, each key component 201 is provided with a heat dissipating plate 203. Each electronic device 200 is connected in one cooling branch 23, and the multiple heat dissipating plates 203 in each electronic device 200 are connected in parallel to the one cooling branch 23.

In other embodiments, each electronic device 200 includes multiple key components 201, each key component 201 is provided with a heat dissipating plate 203. Each heat dissipating plate 203 is connected to one cooling branch 23.

Therefore, the key components 201 of each electronic device 200 can be connected to the cooling branch 23 in different arrangement according to actual requirements to improve the cooling effect.

In further embodiments, a quick connector 42 is provided at each distribution port 41 for connection with the corresponding cooling branch 23. In this way, when replacing the electronic device 200 in the cooling tank 10, the cooling branch 23 and the manifold 40 can be quickly disconnected or connected.

Figure 5:
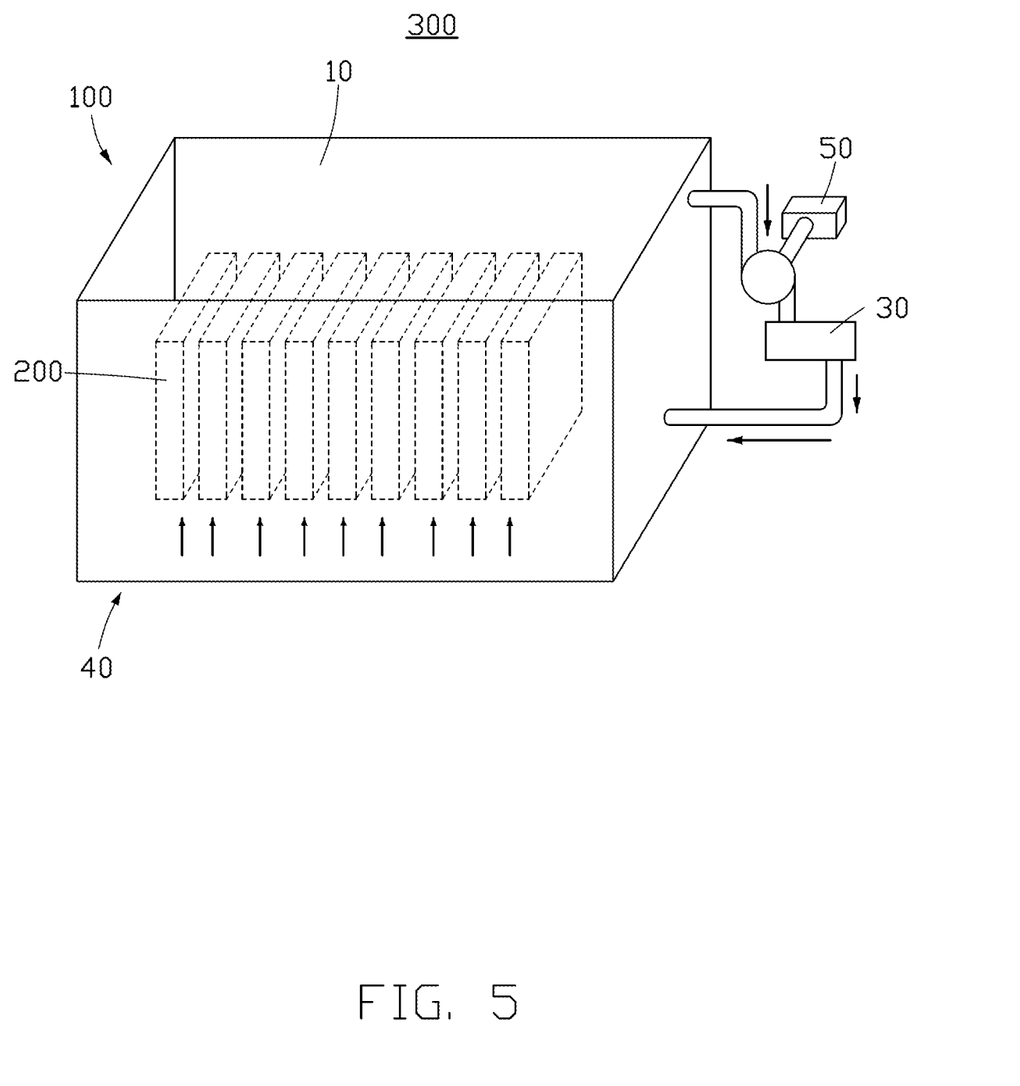
FIG. 5 is a perspective view of an immersed cooling cabinet according to an embodiment of the disclosure.

In further embodiments, referring to FIG. 5, an immersed cooling cabinet 300 is provided. The immersed cooling system 100 above-mentioned is applied to the immersed cooling cabinet 300.

While the disclosure has been described in detail in connection with only a limited number of embodiments, it should be readily understood for the skilled in the art that the disclosure is not limited to such disclosed embodiments. Rather, the disclosure can be modified to incorporate any number of variations, alterations, substitutions, or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description but is only limited by the scope of the appended claims.

What is claimed is:

1. An immersed cooling system for cooling electronic devices, comprising:
   a cooling tank configured for accommodating coolant and multiple electronic devices, the cooling tank comprising an inlet and an outlet, each of the multiple electronic devices comprising key components and common components;
   a liquid cooling circuit connecting to the cooling tank for circulating the coolant for the cooling tank, the liquid cooling circuit comprising:
      a supply line connected to the inlet for supplying the coolant to the cooling tank;
      a manifold connected to the supply line;
      a plurality of cooling branches connected between the manifold and the key components of the multiple electronic devices for transferring the coolant from the supply line to the plurality of cooling branches for cooling the key components of the multiple electronic devices, and
      a return line connected to the outlet for discharging the coolant from the cooling tank;
   a heat exchanger connected to the return line; and
   a pump module connected in the liquid cooling circuit for pumping the coolant, the pump module is configured for controlling flow rate of the coolant passing through the plurality of cooling branches to be higher than that of the coolant in the cooling tank.

2. The immersed cooling system of claim 1, wherein the supply line comprising:
   a proprietary supply line for supplying the coolant to the key components of the electronic devices, and
   a common supply line connected to the inlet for supplying the coolant to the cooling tank.

3. The immersed cooling system of claim 2, wherein the pump module comprises:
   a first pump connected to the proprietary supply line for controlling the coolant passing through the proprietary supply line, and
   a second pump connected to the common supply line for controlling the coolant passing through the common supply line.

4. The immersed cooling system of claim 2, wherein cross-sectional area of the common supply line is greater than that of the proprietary supply line.

5. The immersed cooling system of claim 2, wherein the pump module comprises:
   a third pump connected to the return line for controlling the coolant passing through the proprietary supply line, and
   a plurality of fourth pumps connected to the plurality of cooling branches for controlling the coolant passing through the plurality of cooling branches.

6. The immersed cooling system of claim 2, wherein cross-sectional area of the common supply line is greater than that of one of the plurality of cooling branches.

7. The immersed cooling system of claim 2, wherein
   each of the key components is provided with a heat dissipating plate;
   each of the multiple electronic devices is connected in one of the plurality of cooling branches, and the heat dissipating plates in each of the multiple electronic devices are connected in series to the one of the plurality of cooling branches.

8. The immersed cooling system of claim 2, wherein
   each of the key components is provided with a heat dissipating plate;
   each of the heat dissipating plates is connected to one of the plurality of cooling branches.

9. The immersed cooling system of claim 2, wherein
   each of the key components is provided with a heat dissipating plate;
   each of the multiple electronic devices is connected in one of the plurality of cooling branches, and the heat dissipating plates in each of the multiple electronic devices are connected in parallel to the one of the plurality of cooling branches.

10. An immersed cooling cabinet comprising:
    a cooling tank configured for accommodating coolant and multiple electronic devices, the cooling tank comprising an inlet and an outlet, each of the multiple electronic devices comprising key components and common components;
    a liquid cooling circuit connecting to the cooling tank for circulating the coolant for the cooling tank, the liquid cooling circuit comprising:
       a supply line connected to the inlet for supplying the coolant to the cooling tank;
       a manifold connected to the supply line;
       a plurality of cooling branches connected between the manifold and the key components of the multiple electronic devices for transferring the coolant from the supply line to the plurality of cooling branches for cooling the key components of the multiple electronic devices, and
       a return line connected to the outlet for discharging the coolant from the cooling tank;
    a heat exchanger connected to the return line; and
    a pump module connected in the liquid cooling circuit for pumping the coolant, the pump module is configured for controlling flow rate of the coolant passing through the plurality of cooling branches to be higher than that of the coolant in the cooling tank.

11. The immersed cooling cabinet of claim 10, wherein the supply line comprising:
    a proprietary supply line for supplying the coolant to the key components of the electronic devices, and
    a common supply line connected to the inlet for supplying the coolant to the cooling tank.

12. The immersed cooling cabinet of claim 11, wherein the pump module comprises:
    a first pump connected to the proprietary supply line for controlling the coolant passing through the proprietary supply line, and
    a second pump connected to the common supply line for controlling the coolant passing through the common supply line.

13. The immersed cooling cabinet of claim 11, wherein cross-sectional area of the common supply line is greater than that of the proprietary supply line.

14. The immersed cooling cabinet of claim 11, wherein the pump module comprises:
    a third pump connected to the return line for controlling the coolant passing through the proprietary supply line, and
    a plurality of fourth pumps connected to the plurality of cooling branches for controlling the coolant passing through the plurality of cooling branches.

15. The immersed cooling cabinet of claim 11, wherein cross-sectional area of the common supply line is greater than that of one of the plurality of cooling branches.

16. The immersed cooling cabinet of claim 11, wherein
each of the key components is provided with a heat dissipating plate;
each of the multiple electronic devices is connected in one of the plurality of cooling branches, and the heat dissipating plates in each of the multiple electronic devices are connected in series to the one of the plurality of cooling branches.

17. The immersed cooling cabinet of claim 11, wherein
each of the key components is provided with a heat dissipating plate;
each of the heat dissipating plates is connected to one of the plurality of cooling branches.

18. The immersed cooling cabinet of claim 11, wherein
each of the key components is provided with a heat dissipating plate;
each of the multiple electronic devices is connected in one of the plurality of cooling branches, and the heat dissipating plates in each of the multiple electronic devices are connected in parallel to the one of the plurality of cooling branches.

\* \* \* \* \*